(12) United States Patent
Lee

(10) Patent No.: US 6,337,829 B1
(45) Date of Patent: Jan. 8, 2002

(54) SEMICONDUCTOR MEMORY DEVICE AND METHOD FOR REPAIRING THEREOF

(75) Inventor: Ho Cheol Lee, Seoul (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/648,283

(22) Filed: Aug. 24, 2000

(30) Foreign Application Priority Data

Nov. 18, 1999 (KR) .............................................. 99-51337

(51) Int. Cl.$^7$ ................................................ G11C 8/00
(52) U.S. Cl. ............................ 365/230.03; 365/230.01; 365/230.08
(58) Field of Search ....................... 365/230.03, 230.01, 365/230.06, 230.08, 238.5

(56) References Cited

U.S. PATENT DOCUMENTS

| | | | | |
|---|---|---|---|---|
| 5,787,043 A | * | 7/1998 | Akioka et al. | 365/200 |
| 5,949,731 A | * | 9/1999 | Tsukude | 365/230.01 |
| 6,014,340 A | * | 1/2000 | Sawada | 365/233 |
| 6,108,264 A | * | 8/2000 | Takahashi et al. | 365/230.03 |

* cited by examiner

*Primary Examiner*—Richard Elms
*Assistant Examiner*—VanThu Nguyen
(74) *Attorney, Agent, or Firm*—Skjerven Morrill MacPherson LLP; David W. Heid

(57) ABSTRACT

A semiconductor memory device which includes a plurality of memory cell array blocks, each block including $2^n$ partial blocks selectable in response to n address bits among a plurality of bits address. A partial block select signal generator is used for selecting $½^n$ partial blocks of the $2^n$ partial blocks in each of the plurality of memory cell array blocks by selecting the state of corresponding address bits among the n address bits. A method for repairing a semiconductor memory device which includes a plurality of memory cell array blocks and $2^n$ partial blocks selected by the plurality of memory cell array blocks each responding to n address bits among a plurality of address bits, the method includes selecting only the $½^n$ functional partial blocks of the $2^n$ partial blocks in each of the plurality of memory cell array blocks by selecting the state of corresponding address bits among the n bits of address information.

8 Claims, 6 Drawing Sheets

SEMICONDUCTOR MEMORY DEVICE AND METHOD FOR REPAIRING THEREOF

BACKGROUND OF THE INVENTION

Field of the Invention

The present invention relates to a semiconductor memory device. More specially, the present invention relates to a semiconductor memory device and a repair method thereof which can manufacture a semiconductor memory device having the large capacity into a semiconductor memory device having the small capacity.

Description of the Background Art

It is very important to reduce a chip size without reducing manufacturing process even in case that the capacity of a semiconductor memory device is increased. However, in some devices, a chip size can not be reduced even though process are reduced. The increase of the number of pads has an effect on a chip size. That is, if the number of pads is increased, the area occupied by the pads is increased so that the chip size can not be reduced. Specially, a chip size can not be reduced due to the increase of the number of pads in case of a semiconductor memory device having a lot of data input/output pins.

For example, in case memory cells each having the capacity of N, 2N and 4N are manufactured in a semiconductor memory device through a manufacturing process P1, the chip size of the memory cells is S, 2S and 4S, respectively. However, in case memory cells each having the capacity of 2N and 4N are manufactured in a semiconductor memory device through a manufacturing process P2, the chip size is reduced to S and 2S, respectively. And in case a memory cell having the capacity of 4N is manufactured in a semiconductor memory device through a manufacturing process P3, the chip size is reduced to S. That is, the manufacturing process is simplified to P1, P2 or P3 according to the capacity of memory cells increasing to N, 2N or 4N. A semiconductor memory device with memory cells having the capacity of 4N is manufactured as having the size of 4N through the manufacturing process P1. If manufactured through the process P2, a semiconductor memory device has the size of 2N. A semiconductor memory device has the size of N through the process P3. That is, a semiconductor memory device with memory cells having the capacity of N, 2N or 4N is manufactured into a semiconductor memory device having the size of S by the process P1, P2 or P3.

The process P1 can manufacture a semiconductor memory device which the capacity of memory cells is N, 2N or 4N. The process P2 can manufacture a semiconductor memory device which the capacity of memory cells is 2N or 4N. The process P3 can manufacture a semiconductor memory device which the capacity of memory cells is 4N. That is, it is not impossible to manufacture a semiconductor memory device having the small capacity by using the updated process. That is why a chip size can not be reduced enough to improve the productivity. Accordingly, process for manufacturing a semiconductor memory device which the capacity of memory cells is N, 2N or 4N is different from one another.

However, if a semiconductor memory device having a first capacity manufactured by a first process can be manufactured into a semiconductor memory device having a second, smaller capacity using the same process, then the semiconductor memory device having the second, smaller capacity of an identical physical size can be manufactured even though a different process is not adopted.

In addition, in situations in which only some partial blocks of a semiconductor memory device comprising a plurality of memory cell array blocks are defective, if only normal partial blocks, excluding defective blocks, could be manufactured into a semiconductor memory device having a second, smaller capacity, the yield of the semiconductor memory device could be improved.

SUMMARY OF THE INVENTION

In accordance with one embodiment of the present invention, a semiconductor memory device is provided which comprises a plurality of memory cell array blocks, each including a plurality of partial blocks selectable by n address bits from a plurality of address bits. A partial block select signal generator generates address bits to select a subset of the partial blocks from the plurality of partial blocks in each of the plurality of memory cell array blocks.

According to another aspect of the present invention, a semiconductor memory device is provided which includes a plurality of memory cell array blocks, each including a plurality of partial blocks selectable by n address bits from a plurality of bits address. A partial block select signal generator generates partial block select signals for selecting one-fourth of the partial blocks in each of the plurality of memory cell array blocks by establishing a state of corresponding address bits among the n address bits. The partial block select signal generator further includes means for selecting one-fourth of the partial blocks in each of said plurality of memory cell array blocks by establishing a state of a first address among the n address bits.

In yet another aspect of the invention, a method is provided for repairing a semiconductor memory device having a plurality of memory cell array blocks each including $2^n$ partial blocks selectable in response to n bits address among a plurality of bits address. The method comprises selecting $\frac{1}{2}^n$ partial blocks of the $2^n$ partial blocks in each of the plurality of memory cell array blocks by selecting the state of corresponding address bits among the n address bits.

BRIEF DESCRIPTION OF THE ATTACHED DRAWINGS

Figure 1:
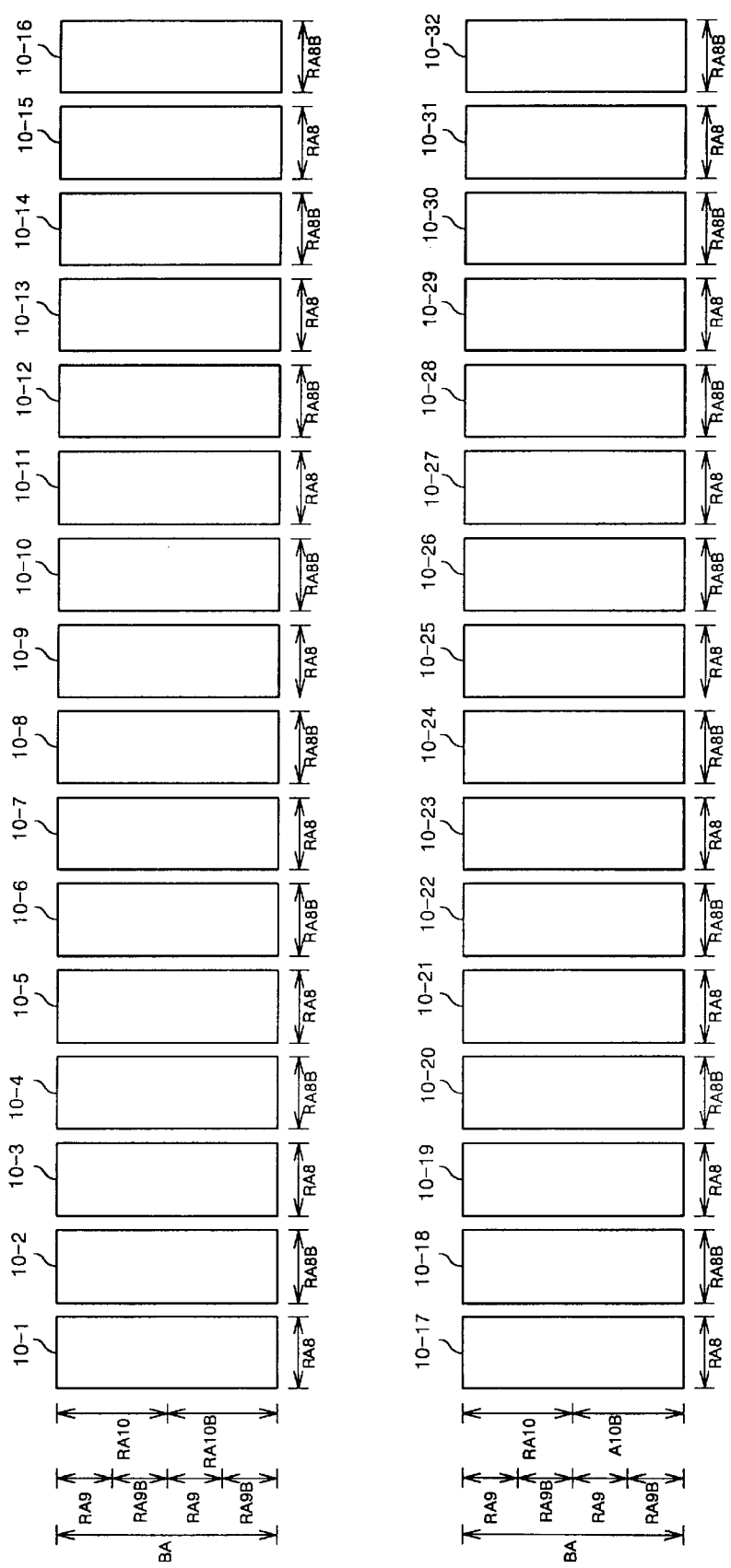
FIG. 1 is a block diagram illustrating a plurality of memory cell array blocks of a general semiconductor memory device.
Figure 3:
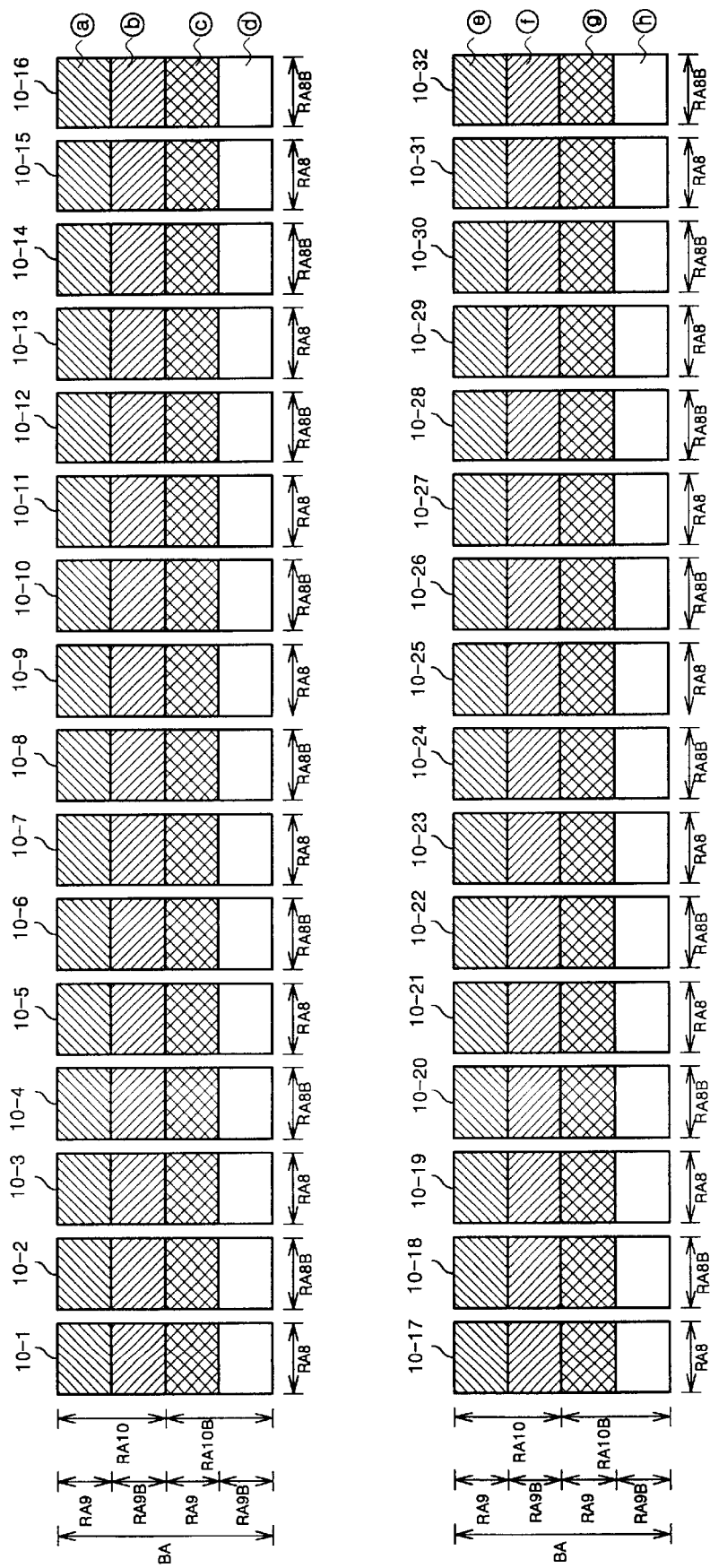

FIG. 3 a block diagram useful in explaining a method for manufacturing a semiconductor memory device having one-quarter of the capacity of the memory cell array blocks shown in FIG. 1.

Figure 2:
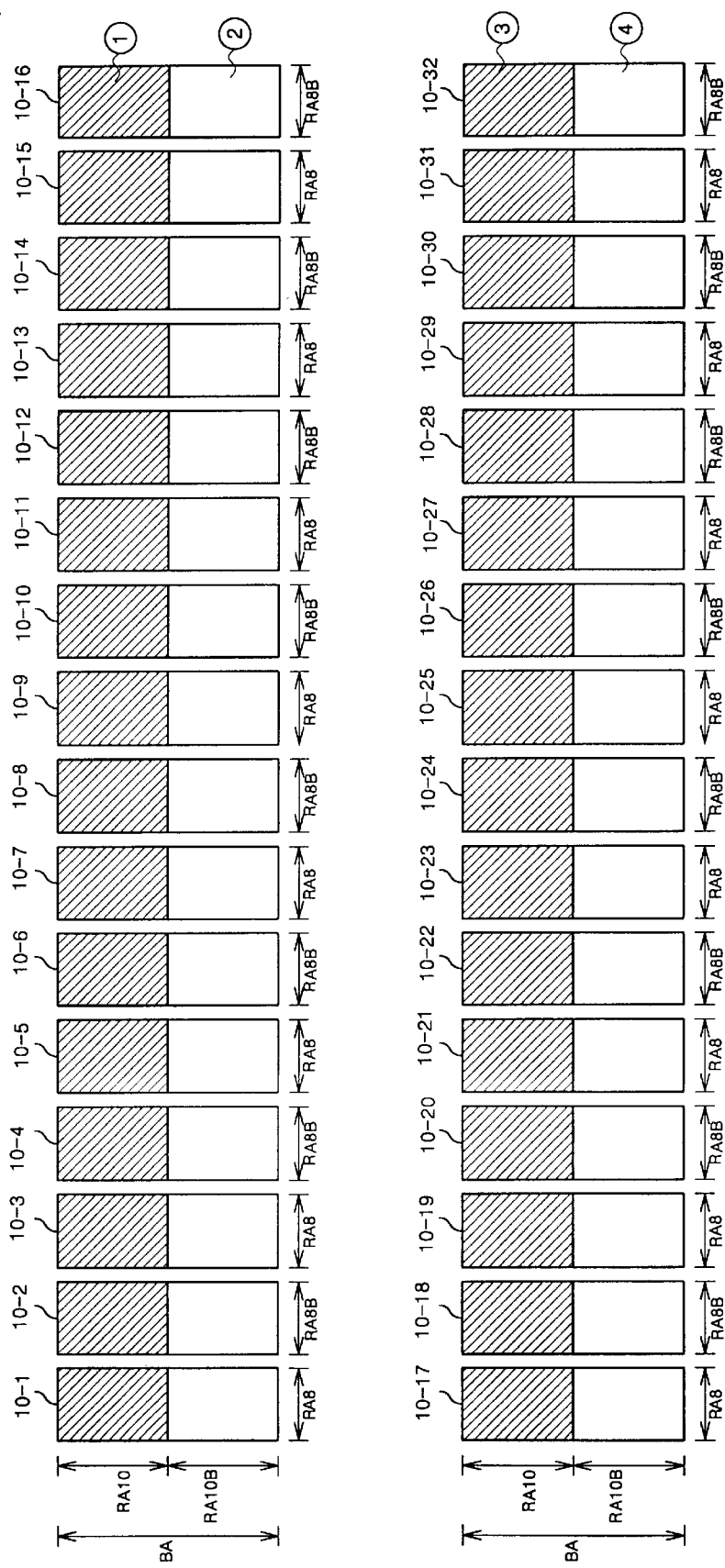
FIG. 2 is a block diagram useful in explaining a method for manufacturing a semiconductor memory device having one-half of the capacity of the memory cell array blocks shown in FIG. 1.
Figure 4:
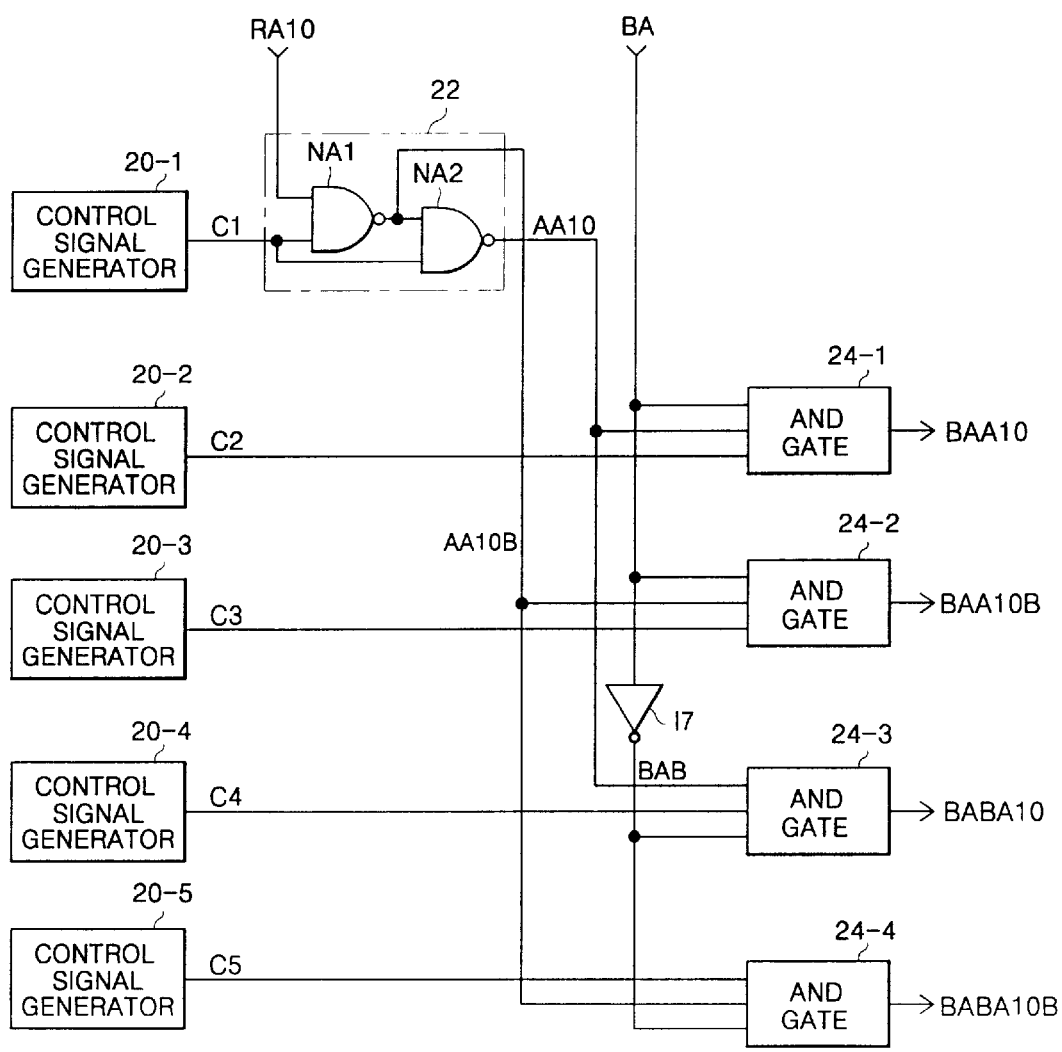

FIG. 4 is a circuit diagram of an embodiment of a partial block select signal generator which can be used to modify the semiconductor memory device of FIG. 1 into the semiconductor memory device of FIG. 2.

Figure 5:
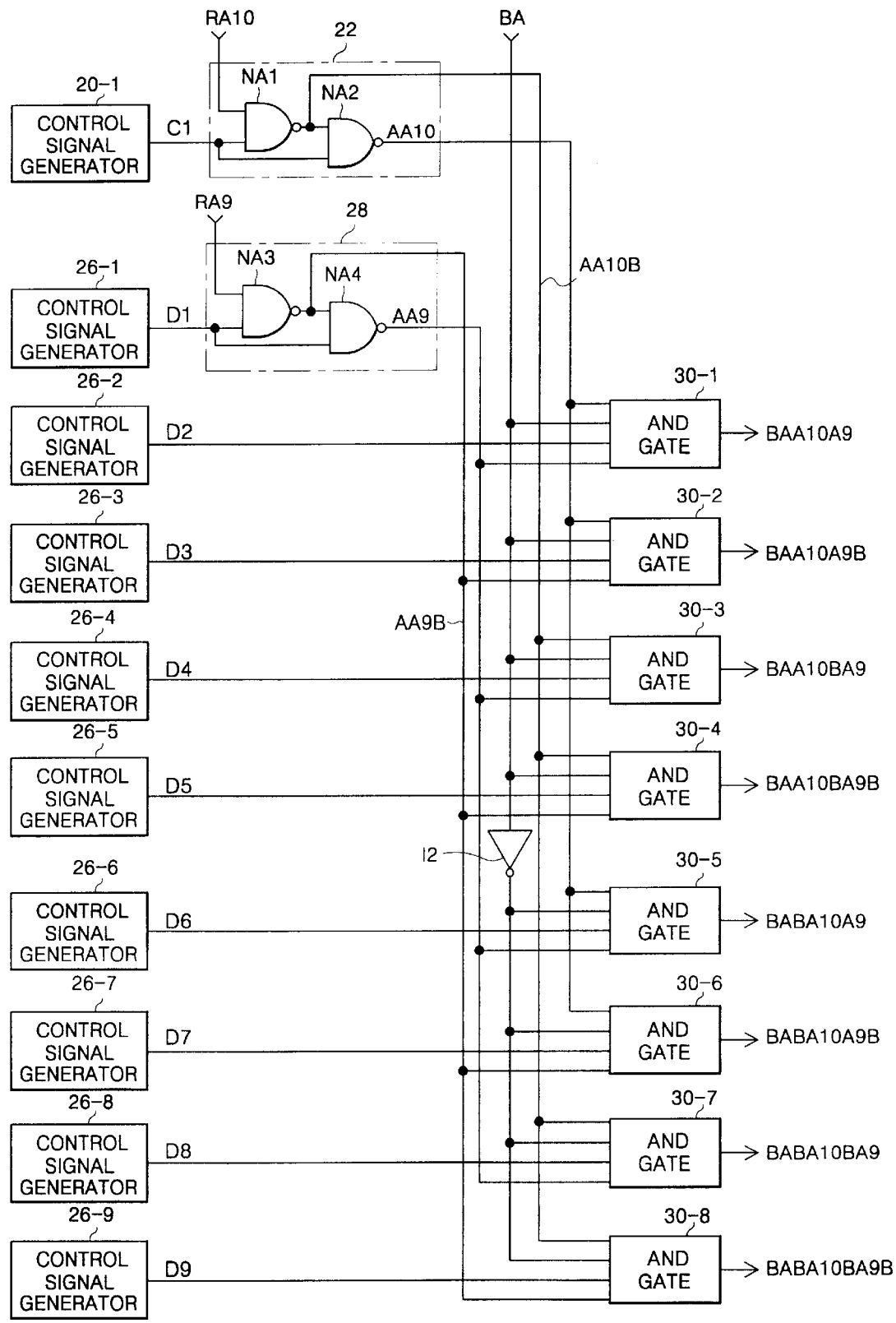

FIG. 5 is a circuit diagram of an embodiment of a partial block select signal generator which can be used to modify the semiconductor memory device of FIG. 1 into the semiconductor memory devices of FIG. 2 and 3.

Figure 6:
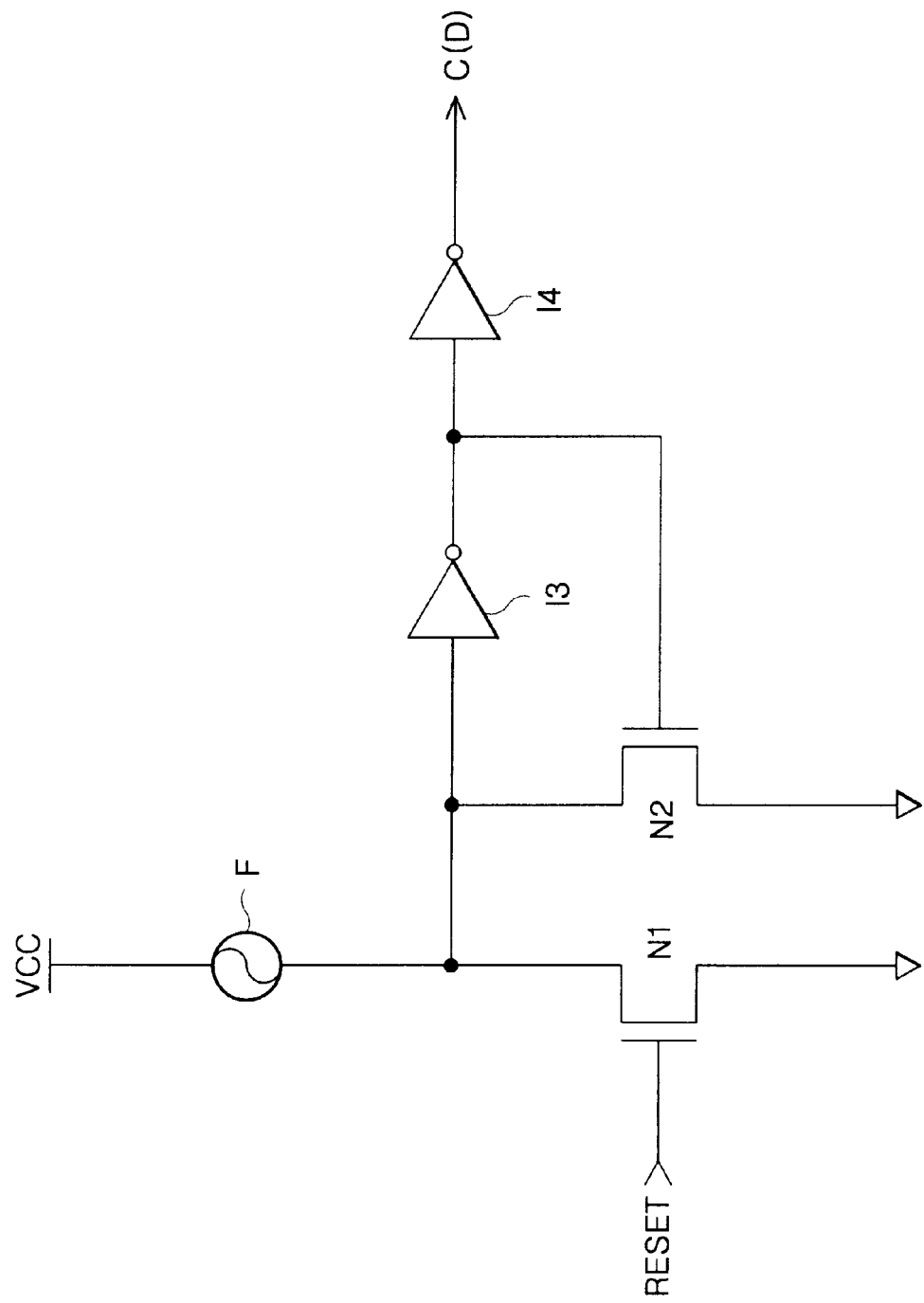

FIG. 6 is a circuit diagram illustrating an embodiment of a control signal generator shown in FIG. 4 and 5.

DETAILED DESCRIPTION OF THE INVENTION

In FIG. 1, 32 data input/output pins are arranged and a bank address BA, and an eleven bit row address RA0~RA10, and an eight bit column address CA0~CA7 are inputted thereto.

In each of memory cell array blocks 10-1, through 10-32, one bit row address RA8 among the row address RA0~RA10 is used as a block select signal, and the remaining row address RA0~RA7, RA9, and RA10 is used as word line select signals for selecting word lines. The column address CA0~CA7 is used as bit line select signals for selecting bit lines. Four bits of data are input/output from the memory cell array blocks 10-1, through 10-32. Accordingly, each of the memory cell array blocks 10-1, through 10-32 has the capacity of 1M{=$2^{10} \times 2^8 \times 2^2$=(the number of word lines)×(the number of bit lines)×(the number of data input/output)}, totally 32M.

A method for enabling blocks illustrated in FIG. 1 is described below.

The memory cell array blocks 10-1, 10-2, through 10-16 are selected by the bank address BA, and the memory cell array blocks 10-17, 10-18, through 10-32 are selected by an inverted bank address BAB. The odd numbered memory cell array blocks (i.e., 10-1, 10-3, . . . , 10-15, 10-17, 10-19, and 10-31) are selected by a row address RA8, and the even numbered memory cell array blocks (i.e., 10-2, 10-4, . . . , 10-16, 10-18, 10 -20, . . . , and 10-32) are selected by an inverted row address RA8B. Word lines of the memory cell array blocks 10-1, 10-2, through 10-32 are selected by decoding row address RA0 to RA7, RA9 and RA10. Bit lines of the memory cell array blocks 10-1, 10-2, through 10-32 are selected by decoding column address CA0 to CA7. In FIG. 1, the row address RA8 is used as a block select signal, but the others can be substituted with the block select signal.

The odd numbered memory cell array blocks 10-1, 10-3, through 10-15 are selected when the bank address BA and row address RA8 is at a high level. The even numbered memory cell array blocks 10-2, 10-4, through 10-16 are selected when the bank address BA and the inverted row address RA8B are at a high level. Also, the odd numbered memory cell array blocks 10-17, 10-19, through 10-31 are selected when the inverted bank address BAB and row address RA8 are at a high level. The even numbered memory cell array blocks 10-18, 10-20, through 10-32 are selected when the inverted bank address BAB and the inverted row address RA8B are at a high level. Four bits of data are input/output from each of selected memory cell array blocks, that is, totally 32 bits data is input/output.

FIG. 2 is a block diagram for explaining a method for manufacturing the semiconductor memory device illustrated in FIG. 1 into a semiconductor memory device in which the capacity of memory cells is 16M, which consists of blocks identical with those shown in FIG. 1.

A method for activating blocks illustrated in FIG. 2 is same as that of FIG. 1. However, one-half of each of memory cell array blocks 10-1, 10-2, through 10-32 is selected for manufacturing a semiconductor memory in which the capacity of memory cells is 32M into a semiconductor memory device which the capacity of memory cell array having is 16M.

That is, in the memory cell array blocks 10-1, 10-2, through 10-32 of FIG. 2, the marked partial blocks ① and ② are selected, or partial blocks ① and ③ are selected. In the other case, the partial blocks ① of the memory cell array blocks 10-1, 10-2, through 10-16 and the partial blocks ④ of the memory cell array blocks 10-17, 10-18, through 10-32 are selected, or the partial blocks ② of the memory cell array blocks 10-1, 10-2, through 10-16 and the partial blocks ③ of the memory cell array blocks 10-17, 10-18, through 10-32 are selected.

As shown in FIG. 2, the partial blocks ① and ③ are selected by the row address RA10 of a high level, and the partial blocks ② and ④ are selected by an inverted row address RA10B of a high level.

Accordingly, if the address RA10 is fixed at a high level or low level, ½ partial blocks of the memory cell array blocks 10-1, 10-2, through 10-32 are selected so that the semiconductor memory device having a capacity of the memory cell array of 32M is manufactured into a semiconductor memory device having a capacity of the memory cell array of 16M.

FIG. 3 a block diagram explaining a method for manufacturing the semiconductor memory device of FIG. 1 into a semiconductor memory device which the capacity of the memory cell array is 8M, which consists of blocks identical with those shown in FIG. 1.

A method for activating blocks illustrated in FIG. 3 is same as that of FIG. 1.

However, ¼ partial blocks are selected for manufacturing the semiconductor memory device which the capacity of the memory cell array is 32M into a semiconductor memory device which the capacity of the memory cell array is 8M.

For example, in the memory cell array blocks 10-1, 10-2, through 10-32, marked partial blocks a and e, marked partial blocks b and f, marked partial blocks c and g, or unmarked partial blocks d and h are selected.

As shown in FIG. 3, the partial blocks a and e are selected by the row address RA10 and RA9 of a high level, and the partial blocks b and f are selected by the row address RA10 and an inverted row address RA9B of a high level. The partial blocks c and g are selected by the inverted row address RA10B and row address RA9 of a high level. The partial blocks d and h are selected by the inverted row address RA10B and RA9B of a high level.

Accordingly, if the row address RA10 and RA9 are fixed at a high level or low level, ¼ partial blocks of the memory cell array blocks 10-1, 10-2, through 10-32 are selected so that the semiconductor memory device with the capacity of the memory cell array of 32M is manufactured into a semiconductor memory device having a capacity of 8M.

FIG. 4 is a block diagram illustrating an embodiment of a partial block select signal generator for configuring the semiconductor memory device of FIG. 1 into the semiconductor memory device of FIG. 2, comprising control signal generators 20-1 to 20-5, an address control circuit 22 including NAND gates NA1 and NA2, an inverter I1 and AND gates 24-1 to 24-4.

An operation of the blocks shown in FIG. 4 is described below.

In case of manufacturing a semiconductor memory device having the capacity of 32M, control signals C1 to C5 of the control signal generators 20-1 to 20-5 are fixed at a high level. Then, the NAND gate NA1 inverts the row address RA10 and outputs the inverted row address AA10B. The NAND gate NA2 inverts an output signal from the NAND gate NA1 and outputs a row address AA10. The AND gates 24-1 and 24-2 output row address AA10 and AA10B as partial block select signals BAA10 and BAA10B, respectively, in response to the bank address BA of a high level. The AND gates 24-3 and 24-4 output the row address AA10 and AA10B as partial block select signals BABA10 and BABA10B, respectively, in response to the inverted bank address BAB of a high level. The partial blocks select signal BAA10 is a signal for selecting the partial blocks ① of the memory cell array blocks 10-1, 10-2, through 10-16 shown in FIG. 2. The partial block select signal BAA10B is a signal for selecting the partial blocks ② of the memory cell array blocks 10-1, 10-2, through 10-16 shown in FIG. 2. The partial block select signal BABA10 is a signal for selecting the partial blocks ③ of the memory cell array blocks 10-17, 10-18, through 10-32 shown in FIG. 2. The partial block select signal BABA10B is a signal for selecting the partial blocks ④ of the memory cell array blocks 10-17, 10-18, through 10-32.

That is, all partial parts of the memory cell array blocks shown in FIG. 1 can be selected according to the state of the row address RA10 externally applied.

In case of manufacturing a semiconductor memory device having the capacity of 16M by selecting the partial blocks ① and ③ of FIG. 2, the control signals C1, C3 and C5 of the control signal generators 20-1, 20-3 and 20-5 are fixed at a low level, and the control signals C2 and C4 of the control signal generators 20-2 and 20-4 are fixed at a high level. Then, the NAND gates NA1 and NA2 generate the inverted row address AA10B and row address AA10 of a high level in response to the control signal C1 of a low level. The AND gate 24-1 outputs the row address AA10 of a high level as the partial block select signal BAA10 by responding to the bank address BA of a high level. The AND gate 24-3 outputs the inverted row address AA10B of a high level as the partial block select signal BABA10 by responding to the inverted bank address BAB of a high level. The AND gates 24-2 and 24-4 output the partial block select signals BAA10B and BABA10B of a low level by responding to the control signals C2 and C5 of a low level.

Accordingly, independently of the row address RA10, in case the control signals C1, C3 and C5 are fixed at a low level and the control signals C2 and C4 fixed at a high level, the partial blocks ① and ③ of FIG. 2 are selected. In case the control signals C1, C2 and C4 are fixed at a low level and the control signals C3 and C5 are fixed at a high level, the partial blocks ② and ④ of FIG. 2 are selected.

Accordingly, the semiconductor memory device having the capacity of 32M is manufactured into a semiconductor memory device having a capacity of 16M.

FIG. 5 is a block diagram explaining an embodiment of a partial block select signal generator for configuring the semiconductor memory device of FIG. 1 into the semiconductor memory devices of FIG. 2 and 3, comprising control signal generators 20-1, 26-1, 26-2, . . . , and 26-9, an address control circuit 22 including NAND gates NA1 and NA2, an address control circuit 28 including NAND gates NA3 and NA4, an inverter I2, and AND gates 30-1, 30-2, . . . , and 30-8.

In FIG. 5, the control signal generator 20-1 and address control circuit 22 have the same construction as those of FIG. 4, using the same numerals as FIG. 4.

The operation of the blocks shown in FIG. 5 is explained below.

In the case of manufacturing a semiconductor memory device having the capacity of 32M, control signals C1, D1, D2, through D9 of the control signal generators 20-1, 26-1, 26-2, through 26-9 are all fixed at a high level. Partial block select signals BAA10A9, BAA10A9B, . . . , BABA10BA9 and BABA10BA9B output from the AND gates 30-1, 30-2, through 30-8 are changed according to the state of row address A10 and A9.

Accordingly, all of the partial blocks a, b, c, d, e, f, g, and h of the memory cell array blocks shown in FIG. 3 can be selected.

In the case of manufacturing a semiconductor memory device having the capacity of 16M by selecting the partial blocks ① and ③, the control signals D1, D2, D3, D6 and D7 of the control signal generators 26-1, 26-2, 26-3, 26-6 and 26-7 are fixed at a high level, and the control signals C1, D4, D5, D8 and D9 of the control signal generators 20-1, 26-4, 26-5, 26-8 and 26-9 are fixed at a low level. The NAND gates NA1 and NA3 generate an inverted row address AA10B and a row address AA10 of a high level, respectively, in response to the control signal C1 of a low level. The NAND gate NA3 generates an inverted row address AA9B by inverting a row address RA9, and the NAND gate NA4 generates a row address AA9 by inverting the inverted row address AA9B. The AND gate 30-1 outputs the row address AA9 as a partial block select signal BAA10A9 in response to a bank address of a high level. The AND gate 30-2 outputs the inverted row address AA9B as a partial block select signal BAA10A9B in response to the bank address BA. The AND gate 30-5 outputs the row address AA9 as a partial block select signal BABA10A9 in response to an inverted bank address BAB of a high level. The AND gate 30-6 outputs the row address AA9B as a partial block select signal BABA10A9B in response to the inverted bank address BAB of a high level.

In the case of manufacturing a semiconductor memory device having the capacity of 16M by selecting the partial blocks ② and ④ shown in FIG. 2, the control signals C1, D2, D3, D6 and D7 of the control signal generators 20-1, 26-2, 26-3, 26-6 and 26-7 are fixed at a low level, and the control signals D1, D4, D5, D8 and D9 of the control signal generators 26-1, 26-4, 26-5, 26-8 and 26-9 are fixed at a high level.

As described above, a semiconductor memory device having the capacity of 32M can be manufactured into a semiconductor memory device of 16M by changing the state of row address and control signals.

In the case of manufacturing a semiconductor memory device having the capacity of 8M by selecting the partial blocks a and e shown in FIG. 3, the control signals D2 and D6 of the control signal generators 26-2 and 26-6 are fixed at a high level, and the control signals C1, D1, D3, D4, D5, D7, D8 and D9 of the control signal generators 20-1, 26-1, 26-3, 26-4, 26-5, 26-7, 26-8 and 26-9 are fixed at a low level. Responding to the control signal C1 of a low level, the NAND gates NA1 and NA2 output the inverted row address AA10B and row address AA10 of a high level, respectively. Responding to the control signal D1 of a low level, the NAND gates NA3 and NA4 output the inverted row address AA9B and row address AA9 of a high level, respectively. The AND gate 30-1 generates a partial block select signal BAA10A9 in response to the bank address of a high level, and the AND gate 30-5 generates a partial block select signal BABA10A9 of a high level in response to the inverted bank address BAB of a high level.

In the case of manufacturing a semiconductor memory device having the capacity of 8M by selecting the marked partial blocks c and g, the control signals C1, D1, D2, D3, D5, D6, D7 and D9 of the control signal generators 20-1, 26-1, 26-2, 26-3, 26-5, 26-6, 26-7 and 26-9 are fixed at a low level, and the control signals D4 and D8 of the control signal generators 26-4 and 26-8 are fixed at a high level.

In the case of manufacturing a semiconductor memory device having the capacity of 8M by selecting the marked partial blocks b and f, the control signals D3 and D7 of the control signal generators 26-3 and 26-7 are fixed at a high level, and the row address RA9 and the control signals C1, D1, D2, D4, D5, D6, D8 and D9 of the control signal generators 20-1, 26-1, 26-2, 26-4, 26-5, 26-6, 26-8 and 26-9 are all fixed at a low level.

In the case of manufacturing a semiconductor memory device having the capacity of 8M by selecting the marked partial blocks d and h, the control signals C1, D1, D2, D3, D4, D6, D7 and D8 of the control signal generators 20-1, 26-1, 26-2, 26-3, 26-4, 26-6, 26-7 and 26-8 are fixed at a low level, and the control signals D5 and D9 of the control signal generators 26-5 and 26-9 are fixed at a high level.

In the same manner, a semiconductor memory device having the capacity of 32M can be manufactured into a semiconductor memory device of 8M by changing the state of the row address and control signals.

Accordingly, a semiconductor memory device having the capacity of 32M can be manufactured into a semiconductor memory device of 16M or 8M by applying the circuit shown in FIG. 5.

FIG. 6 is a circuit diagram illustrating an embodiment of the control signal generators shown in FIG. 4 and 5, comprising a fuse F, NMOS transistors N1 and N2, and inverters I3 and I4.

Operation of the circuit shown in FIG. 5 is described below.

When power is applied, a reset signal RESET is transitioned to a high level, and NMOS transistor N1 is turned on by responding to the reset signal RESET of a high level. The NMOS transistor N1 transmits a signal of a low level to a drain. The inverters I3 and I4 generate a control signal C(D) by buffering the signal of a low level.

In the case in which fuse F is cut and the reset signal RESET is transitioned to a low level, the NMOS transistor is turned on by responding to a signal of a high level output from the inverter I3. The NMOS transistor outputs a signal of a low level to a drain. The inverters I3 and I4 generate a control signal C(D) by buffering the signal of a low level. The control signal C(D) is latched by the inverter I3 and NMOS transistor N2 to be kept at a low level.

In the case where the reset signal RESET is transitioned to a low level without cutting the fuse F, a signal of a high level is transferred to the drain of the NMOS transistor N1 through the fuse F. The inverters I3 and I4 generate an output signal by buffering the signal of a high level, and generate a control signal C(D) by buffering the signal of a high level. The control signal C(D) is latched by the inverter I3 and NMOS transistor N2 to be kept at a high level.

In the control signal generator shown in FIG. 6, if the power supply is applied, the reset signal RESET is applied and then the control signal C(D) is reset to a low level. In case the fuse F of the control signal generator is not cut, the control signal C(D) is fixed at a high level. In case the fuse F is cut, the control signal C(D) is fixed at a low level.

In the above-described embodiments, the control signal generators are constructed by using a fuse option, but other methods instead of the fuse option can be used in the control signal generators.

Accordingly, in case a plurality of memory cell array blocks have defective partial blocks, the semiconductor memory device can be manufactured into a semiconductor memory device having the small capacity by excluding the defective partial blocks.

The semiconductor memory device and the method for repairing thereof according to the present invention can manufacture a semiconductor memory device having the large capacity into a semiconductor memory device having the small capacity.

Also, just normal partial blocks except for defective blocks can be manufactured into a semiconductor memory device having the small capacity by using the semiconductor memory device and repairing method of this device, thereby improving the yield of the semiconductor memory device.

I claim:

1. A semiconductor memory device comprising:

a plurality of memory cell array blocks, each including a plurality of partial blocks selectable by n address bits from a plurality of address bits; and a partial block select signal generator for generating address bits to select a subset of the partial blocks of the plurality of partial blocks in each of said plurality of memory cell array blocks.

2. A semiconductor memory device comprising:

a plurality of memory cell array blocks, each including a plurality of partial blocks selectable by n address bits from a plurality of bits address; and a partial block select signal generator for generating partial block select signals for selecting one-fourth of the partial blocks in each of said plurality of memory cell array blocks by establishing a state of corresponding address bits among said n address bits, and wherein said partial block select signal generator further includes means for selecting one-half of the partial blocks in each of said plurality of memory cell array blocks by establishing a state of a first address among said n address bits.

3. The semiconductor memory device as claimed in claim 2, wherein said partial block select signal generator comprises:

first to sixth control signal generators for generating respectively a first to sixth control signals;

a first address control circuit for generating a first signal and a first inverted signal in response to receipt of said first address and said first control signal;

a second address control circuit for generating a second signal and a second inverted signal in response to receipt of said second address and said second control signal; and a partial block select signal generator for generating ANDed output signals of said first signal and said second signal, said first signal and said second inverted signal, said first inverted signal and second signal, and said first inverted signal and second inverted signal as partial block select signals in response to said third, fourth, fifth and sixth control signals, respectively.

4. The semiconductor memory device as claimed in claim 3, wherein each of said control signal generators comprises:

a first fuse connected between a first power supply terminal and a first node;

a first NMOS transistor having a drain connected to said first node, a gate for receipt of a reset signal, and a source connected to a second power supply terminal;

a second NMOS transistor having a drain connected to said first node and a source connected to said second power supply terminal;

a first inverter having an input connected to said first node for inverting a signal provided by said first node and applying said inverted signal to a gate of said second NMOS transistor; and a second inverter having an input coupled to an output of said first inverter for generating said control signal by inverting an output signal from said first inverter.

5. A semiconductor memory device, comprising:

a plurality of memory cell array blocks, each including a plurality of partial blocks selectable by n address bits from a plurality of address bits; and a partial block select signal generator for generating partial block select signals for selecting one-half of the partial blocks in each of said plurality of memory cell array blocks by establishing a state of corresponding address bits among said n bits address.

6. The semiconductor memory device as claimed in claim 5, wherein said partial block select signal generator comprises:

first to third control signal generators for generating, respectively first to third control signals;

an address control circuit for generating a first signal and first inverted signal in response to receipt of said corresponding address bits and said first control signal; and partial block select signal generators for generating said first and second partial block select signals in response to said second and third control signals respectively.

7. The semiconductor memory device as claimed in claim 6, wherein each of said control signal generators comprises:

a first fuse connected between a first power supply terminal and a first node;

a first NMOS transistor having a drain connected to said first node, a gate for receipt of a reset signal, and a source connected to a second power supply terminal;

a second NMOS transistor having a drain connected to said first node and a source connected to said second power supply terminal;

a first inverter having an input connected to said first node and for inverting a signal provided by said first node and applying said inverted signal to a gate of said second NMOS transistor; and a second inverter having an input coupled to an output of said first inverter for generating said control signals by inverting an output signal from said first inverter.

8. A method for repairing a semiconductor memory device comprising a plurality of memory cell array blocks, each including $2^n$ partial blocks selectable in response to n address bits among a plurality of address bits, the method comprising selecting ½ partial blocks of $2^n$ partial blocks in each of said plurality of memory cell array blocks by selecting the state of corresponding address bits among said n address bits.

* * * * *